(12) United States Patent
Lin et al.

(10) Patent No.: US 9,224,719 B2
(45) Date of Patent: Dec. 29, 2015

(54) LIGHT EMITTING SEMICONDUCTOR

(71) Applicant: DELTA ELECTRONICS, INC., Guishan Township (TW)

(72) Inventors: Li-Fan Lin, Taoyuan County (TW); Ching-Chuan Shiue, Taoyuan County (TW); Wen-Chia Liao, Taoyuan County (TW); Shih-Peng Chen, Taoyuan County (TW)

(73) Assignee: DELTA ELECTRONICS, INC. (TW)

( * ) Notice: Subject to any disclaimer, the term of this patent is extended or adjusted under 35 U.S.C. 154(b) by 0 days.

(21) Appl. No.: 14/503,978

(22) Filed: Oct. 1, 2014

(65) Prior Publication Data
US 2015/0014714 A1    Jan. 15, 2015

Related U.S. Application Data

(63) Continuation of application No. 13/604,021, filed on Sep. 5, 2012, now Pat. No. 8,882,313.

(30) Foreign Application Priority Data

May 23, 2012    (TW) ............................. 10118299 A

(51) Int. Cl.
*H01L 25/075*    (2006.01)
*H01L 33/54*    (2010.01)
*H01L 33/62*    (2010.01)
*H01L 33/50*    (2010.01)

(52) U.S. Cl.
CPC .......... *H01L 25/0753* (2013.01); *H01L 33/507* (2013.01); *H01L 33/54* (2013.01); *H01L 33/62* (2013.01); *H01L 2224/48091* (2013.01); *H01L 2224/48247* (2013.01); *H01L 2924/19107* (2013.01); *H01L 2924/3025* (2013.01)

(58) Field of Classification Search
CPC ... H01L 25/0753; H01L 33/507; H01L 33/54; H01L 33/62
See application file for complete search history.

(56) References Cited

U.S. PATENT DOCUMENTS

| 2009/0078455 A1* | 3/2009 | Takakusaki et al. | .......... 174/260 |
| 2010/0033976 A1* | 2/2010 | Sun et al. | ...................... 362/382 |
| 2010/0321920 A1 | 12/2010 | Wu et al. | |
| 2011/0315956 A1* | 12/2011 | Tischler et al. | .................. 257/13 |

* cited by examiner

*Primary Examiner* — Anne Hines
(74) *Attorney, Agent, or Firm* — Hauptman Ham, LLP

(57) ABSTRACT

A light emitting semiconductor element includes at least two electrically conductive units, at least a light emitting semiconductor die and a light transmitting layer. A groove is located between the two electrically conductive units. The light emitting semiconductor die is cross over the electrically conductive units. The light transmitting layer covers the light emitting semiconductor and partially fills within the groove for linking the electrically conductive units.

15 Claims, 20 Drawing Sheets

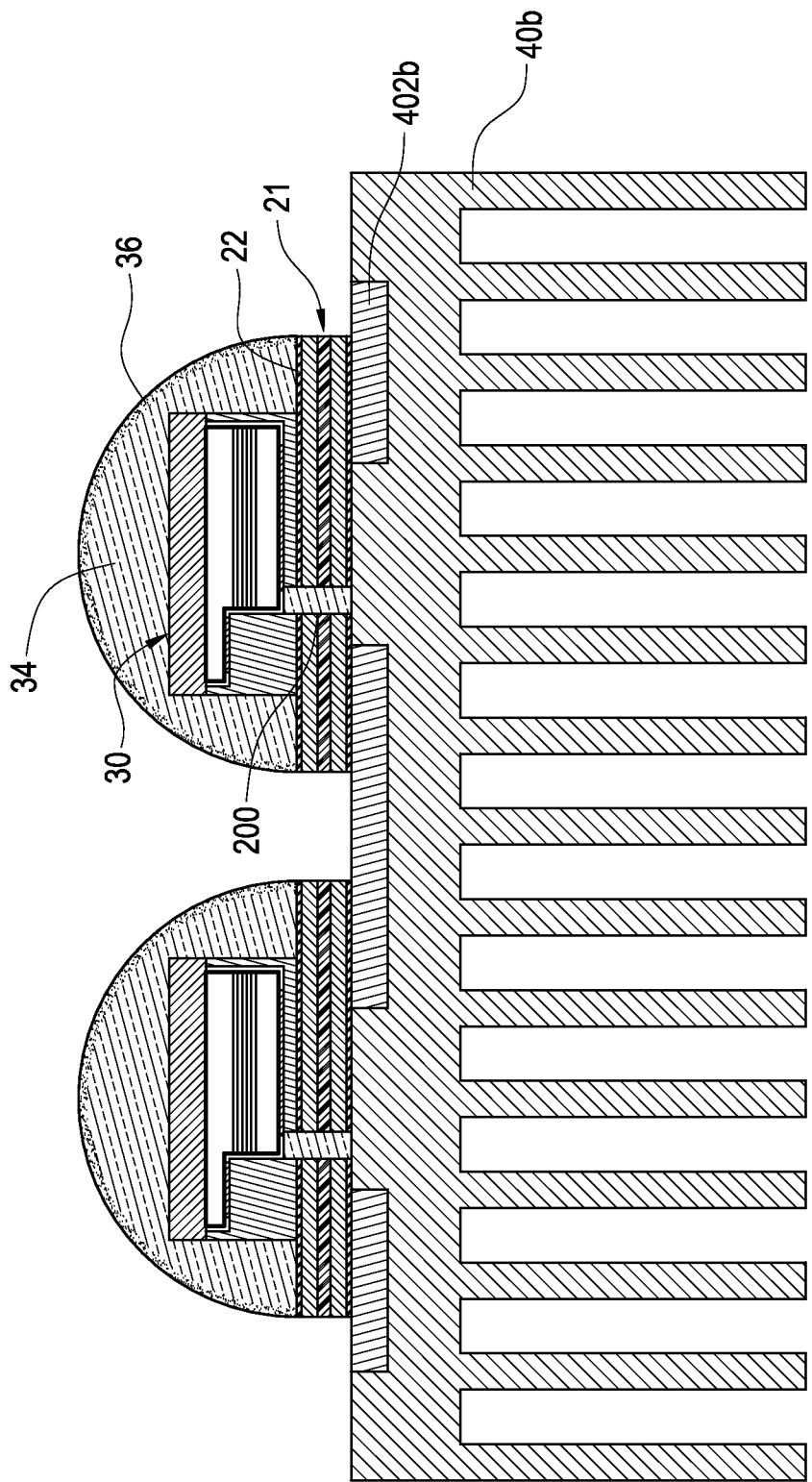

LIGHT EMITTING SEMICONDUCTOR

CROSS-REFERENCE TO RELATED APPLICATIONS

This application is a continuation application of U.S. application Ser. No. 13/604,021 filed on Sep. 5, 2012. The entire disclosure is incorporated herein by reference.

BACKGROUND OF THE INVENTION

1. Field of the Invention

The present invention relates to a light emitting semiconductor element, and in particular to a light emitting diode (LED) element.

2. Description of Prior Art

Reference is made to FIG. 1, which is a sectional view of conventional light emitting semiconductor element.

The light emitting semiconductor element includes a first lead frame 800, a die-carrying frame 802, a second lead frame 804, a light emitting diode (LED) die 806, an isolating body 808, a plurality of wires 810 and a transparent adhesive 814. The isolating body 808 is made of opaque adhesive, such as polyphthalamide (PPA), for fastening the first lead frame 800, the chip-carrying frame 802 and the second lead frame 804 and for forming a die bonding area 812 of cup shape. The die-carrying frame 802 is exposed to the die-bonding area 812. The isolating body 808 is formed by inject molding and arranged at the fringe of the first lead frame 800, the die-carrying frame 802 and the second lead frame 804.

The LED die 806 is placed on the die-carrying frame 802 and electrically connected to the first lead frame 800 and the second lead frame 804 through the wires 810 (such as bonding lines). The transparent adhesive 814 is disposed within the die-bonding area 812 to cover the LED die 806 and to protect the wires 810.

Accordingly, the first lead frame 800, the die-carrying frame 802, the second lead frame 804, the isolating body 808 and the transparent adhesive 814 collectively and air-tightly cover the LED die 806. The isolating body 808, however, has high thermal resistance and causes bad thermal conductive effect. Moreover, the volume of the isolating body 808 is the major cause accounted for the size-down difficulty the light emitting semiconductor element. Furthermore, the resin of manufacturing the isolating body 808 will age as time elapses and reliable issue accordingly arises.

SUMMARY OF THE INVENTION

In order to reduce the volume of the light emitting semiconductor element, enhance heat dissipating effect and reduce manufacturing cost, the present invention provides a light emitting semiconductor element. The light emitting semiconductor element includes at least two electrically conductive units, at least one light emitting semiconductor die and a light transmitting layer. A groove is located between the two electrically conductive units, and the light emitting semiconductor die is cross over the electrically conductive units. The light transmitting layer covers the light emitting semiconductor die and at least fill within the groove for linking the two electrically conductive units.

The present invention provides a light emitting semiconductor element. The light emitting semiconductor element includes at least two electrically conductive units, at least one light emitting semiconductor die, at least one wire and a light transmitting layer. A groove is located between the two electrically conductive units. The light emitting semiconductor die is placed on one of the electrically conductive units. The wire is cross over the light emitting semiconductor die and another electrically conductive unit. The light transmitting layer covers the light emitting semiconductor die, the wire and at least fill within the groove for linking the electrically conductive units.

The present invention also provides a manufacturing method of light emitting semiconductor element, and includes following steps: a) providing a first electrically conductive layer; b) forming at least one groove on the first electrically conductive layer; c) placing at least one light emitting semiconductor die on the first electrically conductive layer and electrically connected to the first electrically conductive layer at two sides of the groove; d) forming a light transmitting layer on the first electrically conductive layer and the light emitting semiconductor die, the light transmitting layer covering the light emitting semiconductor die, linking the first electrically conductive layer and at least partially filling within the groove.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

FIG. 4B is a sectional view of a lighting module according to a second embodiment of the present invention.

DETAILED DESCRIPTION OF THE INVENTION

A preferred embodiment of the present invention will be described with reference to the drawings.

Reference is made to FIG. 2A to 2J, which are process diagrams showing the manufacturing method of the light emitting semiconductor element according to a first embodiment of the present invention. The light emitting semiconductor element may be, but not limited to, light emitting diode.

Figure 1:
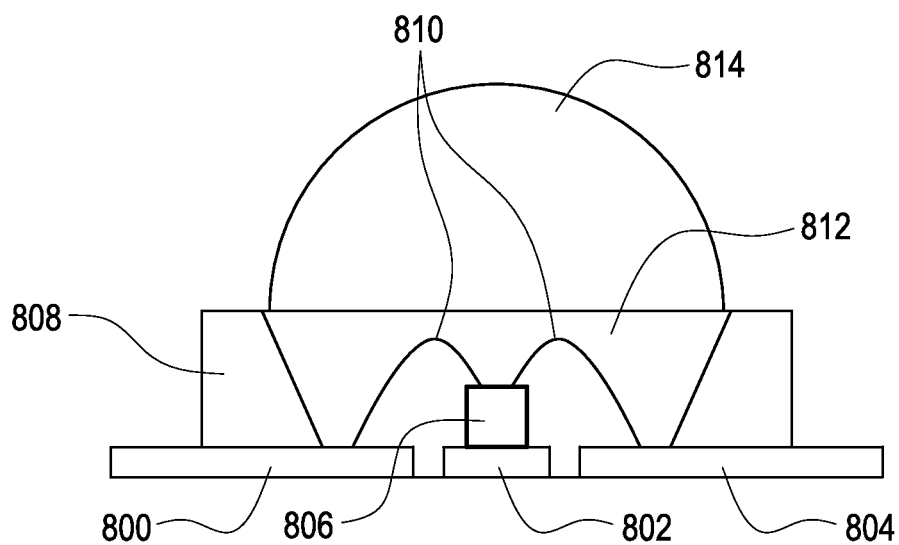
FIG. 1 is a sectional view of a conventional light emitting semiconductor element.
Figure 2A:
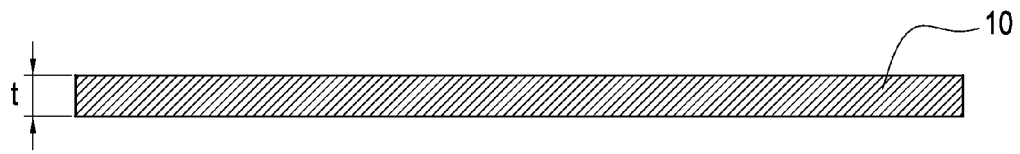
FIG. 2A-FIG. 2J are process diagrams showing the manufacturing method of the light emitting semiconductor element according to a first embodiment of the present invention.

As shown in FIG. 2A, a first electrically conductive layer 10 is provided at first. The first electrically conductive layer 10 is of plate shape and made of material with good electrically conductive property (such as metal), and the metal is, for example, copper. In an exemplary embodiment, the thickness t of the first electrically conductive layer 10 is larger than 5 micrometers (μm) for enhancing heat dissipating effect of the light emitting semiconductor element.

Figure 2B:
Figure 2C:
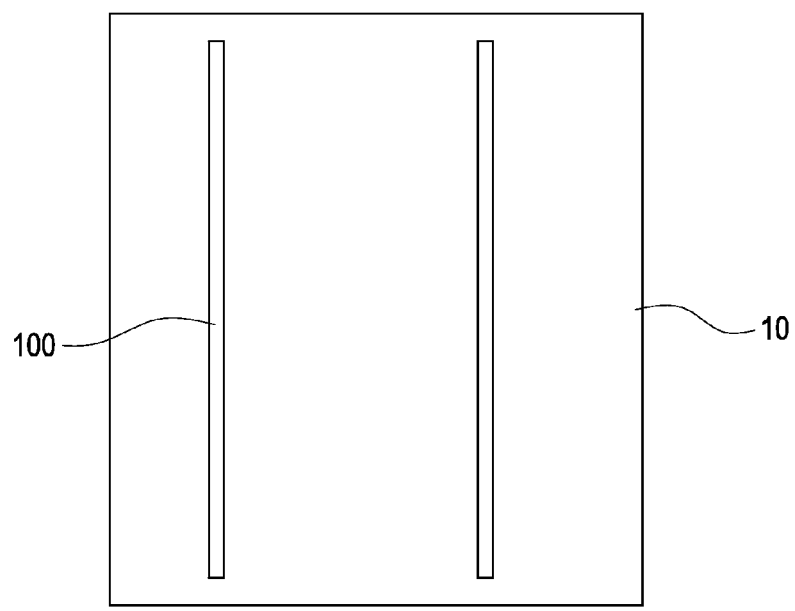

As sown in FIG. 2B, a groove 100 is formed on the first electrically conductive layer 10. The grooves 100 may be formed on the first electrically conductive layer 10 by stamping, etching or half-etching. The amount of the groove 100 may be one or more, and in this embodiment, the grooves are, for example, but not limited to, two. As shown in FIG. 2C, the grooves 100 are, but not limited to, arranged in parallel.

Figure 2D:
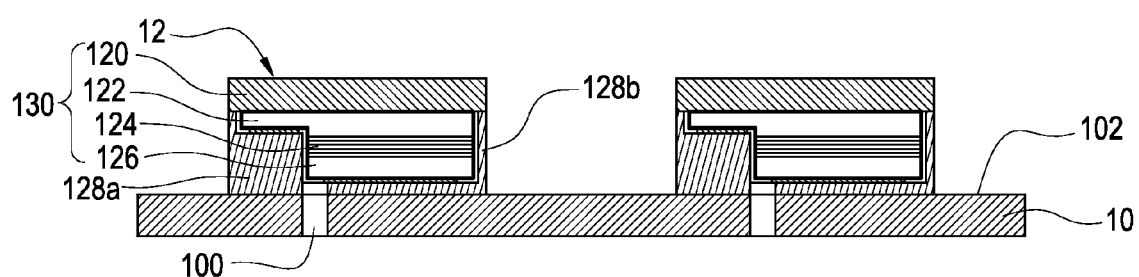
Figure 2E:
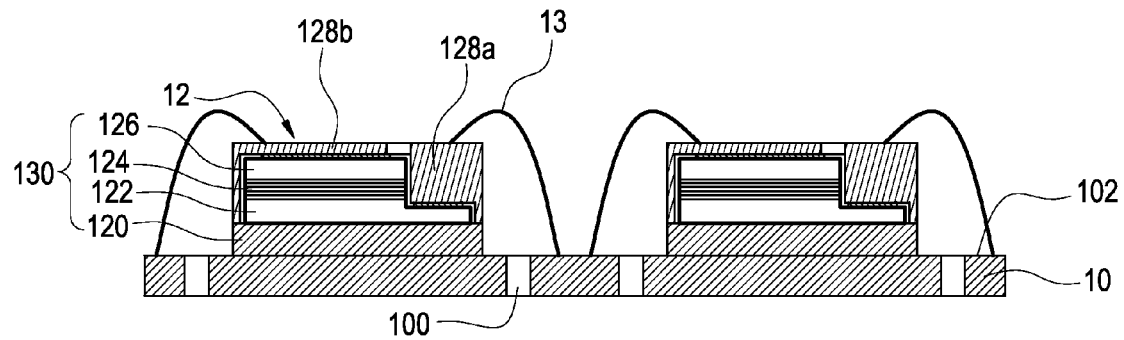
Figure 2F:
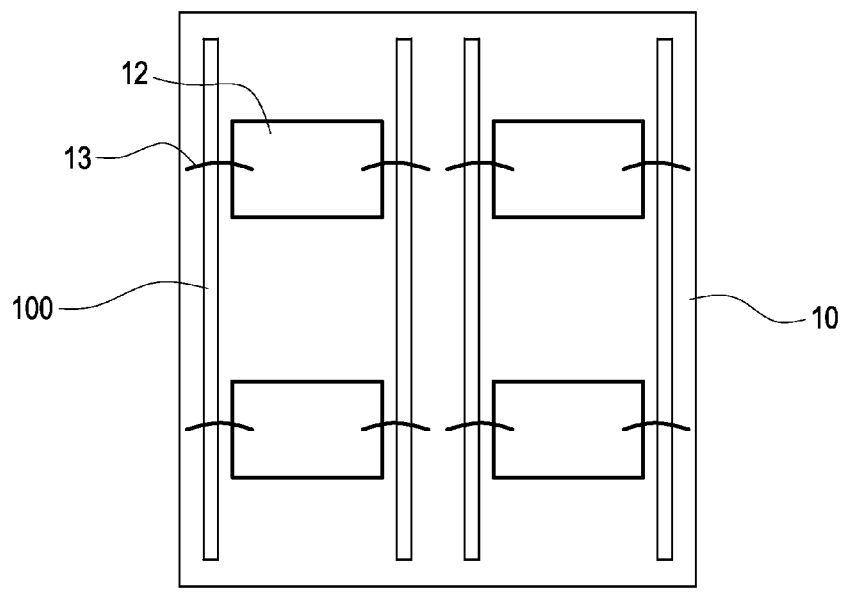

Accordingly, at least one light emitting semiconductor die 12 is placed on the first electrically conductive layer 10 and electrically connected thereto, as shown in FIGS. 2D, 2E and 2F. The amount of the light emitting semiconductor die 12 may be one or more, and in this embodiment, the amount of the light emitting semiconductor dies 12 are, for example, two, and the light emitting semiconductor dies 12 are preferably of light emitting diode dies. Each of the light emitting semiconductor dies 12 includes a plurality of semiconductor layers 130 and two connecting pads 128a and 128b disposed on the semiconductor layers 130, so that the light emitting semiconductor die 12 is of lateral structure. In the practical application, the light emitting semiconductor die 12 may also be of vertical structure. In this embodiment, the semiconductor layers 130 include a substrate 120, an N-type gallium nitride (GaN) 122, a multiple quantum well (MQW) 124 and a P-type gallium nitride 126 disposed in sequence. The connecting pad 128a is disposed on the N-type gallium nitride 122 and the connecting pad 128b is disposed on the P-type gallium nitride 126. Each light emitting semiconductor die 12 emits blue light. However, in the practical application, lighting color and stacking structure of the semiconductor layers 130 may be adjusted for practical demand and limitation.

As shown in FIG. 2D, the light emitting semiconductor dies 12 are placed on the upper surface 102 of the first electrically conductive layer 10 in flip chip manner, and the connecting pads 128a and 128b of the light emitting semiconductor dies 12 are cross the grooves 100 and connected to the first electrically conductive layer 10. In addition, the grooves 100 are partially exposed to the disposing range of the light emitting semiconductor dies 12. The two connecting pads 128a and 128b are electrically connected to the first electrically conductive layer 10 by soldering. However, the two connecting pads 128a and 128b may also be electrically connected to the first electrically conductive layer 10 by spreading silver glue or electrical silicone resin.

Figure 2G:
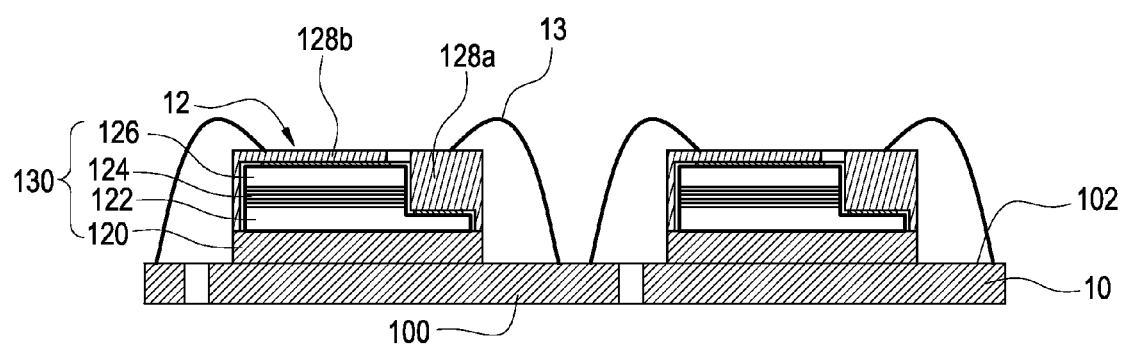

As shown in FIGS. 2E, 2F and 2G, the two pads 128a and 128b of the light emitting semiconductor dies 12 may also be electrically connected to the first electrically conductive layer 10 at two sides of the grooves 100 through a plurality of wires 13. The light emitting semiconductor dies 12 are placed on the first electrically conductive layer 10, and the disposing direction of light emitting semiconductor dies 12 shown in the FIG. 2E and FIG. 2G are opposite to that shown in FIG. 2D. It should be noted that the two connecting pads 128a and 128b of the light emitting semiconductor dies 12 must be respectively electrically connected to the first electrically conductive layer 10 at two sides of the groove 100 to prevent from short circuit problem.

As shown in FIG. 2E and FIG. 2F, the first electrically conductive layer 10 includes four grooves 100, the light emitting semiconductor dies 12 are placed between each two grooves 100. One end of each wire 13 is connected to the connecting pads 128a and 128b of the light emitting semiconductor die 12, and another one is across the groove 100 and connected to the first electrically conductive layer 10. As shown in FIG. 2G, the light emitting semiconductor dies 12 are placed on the first electrically conductive layer 10 at one side of the grooves 100, and the connecting pad 128a of each light emitting semiconductor die 12 is electrically connected thereto through wire 13, the connecting pad 128b of each light emitting semiconductor die 12 is electrically connected to the first electrically conductive layer 10 at another side of the groove 100 through wire 13. It should be noted that when the light emitting semiconductor die 12 is of vertical structure, a connecting pad disposed on one side of the semiconductor layers can be directly and electrically connected to the first electrically conductive layer 10 at one side of the groove, and another connecting pad can be electrically connected to the first electrically conductive layer 10 at another side of the groove.

Figure 2H:
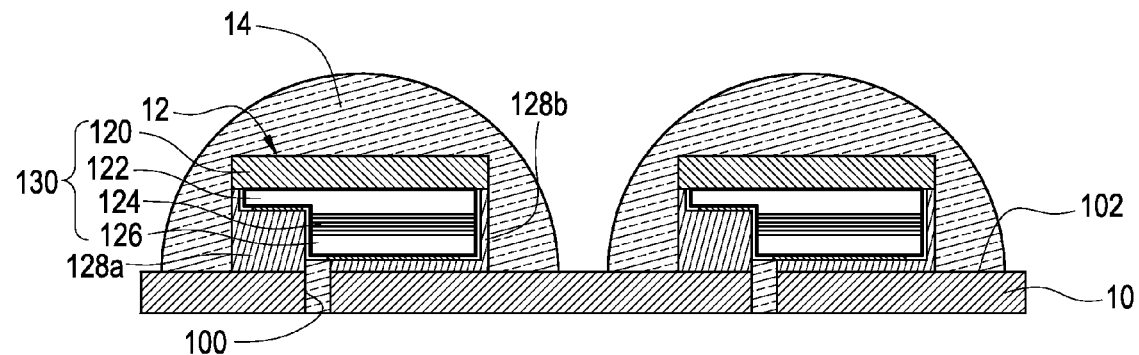

Accordingly, as shown in FIG. 2H, a light transmitting layer 14 is formed and covers the light emitting semiconductor dies 12, and partially fills within the grooves 100 through the grooves 100 exposed to the light emitting semiconductor dies 12. Namely, the light transmitting layer 14 and the first electrically conductive layer 10 collectively and compactly cover the light emitting semiconductor dies 12 and link the first electrically conductive layer 10 and the light emitting semiconductor dies 12. The light transmitting layer 14 is preferably made of light-pervious isolating material, such as silicone resin, for providing good isolating effect. In this embodiment, the light transmitting layer 14 is substantially of hemisphere shape for effectively enhancing light extracting effect. However, in the practical application, the shape of the light transmitting layer 14 may be adjusted for practical demand and limitation. The light transmitting layer 14 may be formed by molding, dispensing or placing lens. As mentioned above, the light transmitting layer 14 links the first electrically conductive layer 10 and the light emitting semiconductor dies 12, and protects the light emitting semiconductor dies 12, as well as provides good isolating effect and enhances light extracting effect.

Figure 2I:
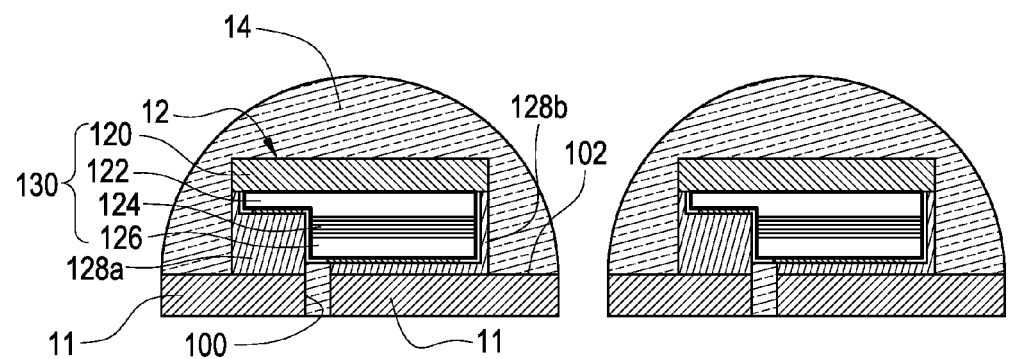

As shown in FIG. 2I, a plurality of light emitting semiconductor elements are formed by cutting the first electrically conductive layer 10 along the edge of the light transmitting layer 14. Simultaneously, the electrically conductive layer 10 is separated into at least two electrically conductive units 11, and the groove 100 is between each two electrically conductive units 11. In addition, each two electrically conductive units 11 are not electrically connected to each other for preventing the light emitting semiconductor from short circuit.

Thus, the light emitting semiconductor elements shown in FIG. 2I is an embodiment according to the present invention. The light emitting semiconductor element includes two electrically conductive units 11, a light emitting semiconductor die 12 and a light transmitting layer 14. The two electrically conductive units 11 are made of electrically conductive material. Preferably, the thickness t of the two electrically conductive units 11 is larger than 5 micrometers for reaching good heat dissipating property, and a groove 100 is located between the two electrically conductive units 11. The light emitting semiconductor die 12 is placed on the two electrically conductive units 11, and includes a plurality of semiconductor layers 130 and two connecting pads 128a and 128b. The two connecting pads 128a and 128b are electrically connected to the two electrically conductive units 11. A surface area of the electrically conductive units 11 is large than a surface area of the light emitting semiconductor die 12. The light transmitting layer 14 covers the light emitting semiconductor die 12 and at least partially fills within the groove 100, so as to link the light emitting semiconductor die 12 and the electrically conductive units 11, and to protect the light emitting semiconductor die 12 and enhance light extracting effect. In a preferable embodiment, the light emitting semiconductor die 12 is directly placed on the electrically conductive units 11, and the thickness t of the electrically conductive units 11 is larger than 5 micrometers for quickly conducting heat generated by the light emitting semiconductor die 12.

Figure 2J:
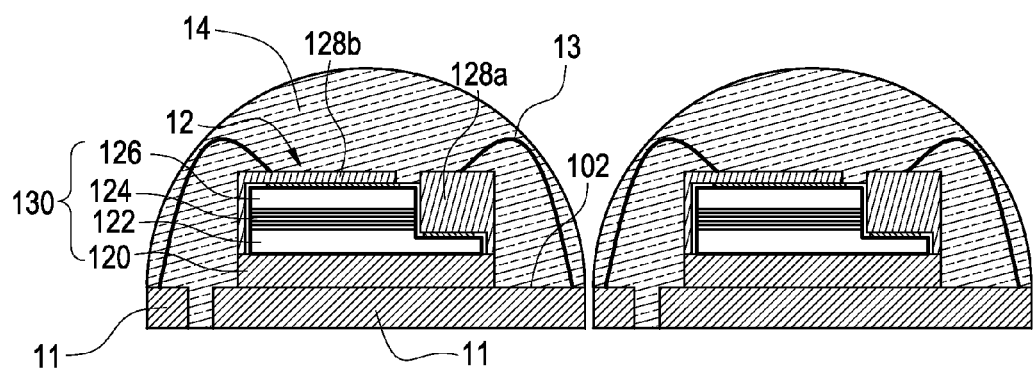

Besides, the light emitting semiconductor die 12 of the light emitting semiconductor element may be placed on one of the electrically conductive unit 11, and electrically connected to another electrically conductive unit through at least one wire 13, as shown in FIG. 2J. The wires 13 are across the connecting pads 128a and 128b and the electrically conductive units 11 for electrically connected the light emitting semiconductor die 12 and the electrically conductive units 11.

Figure 3A:
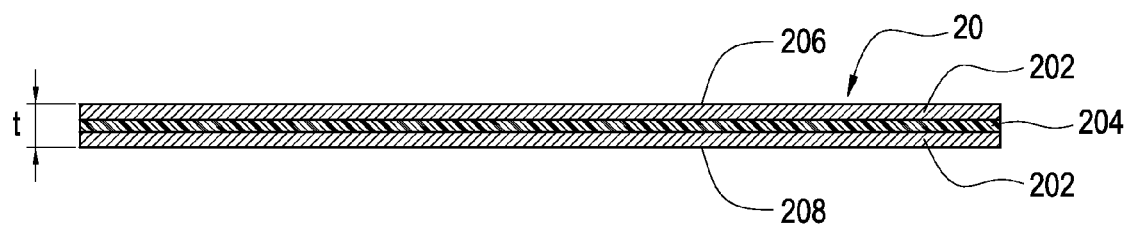
FIG. 3A-FIG. 3Z are process diagrams showing the manufacturing method of the light emitting semiconductor element according to a second embodiment of the present invention.
Figure 3B:
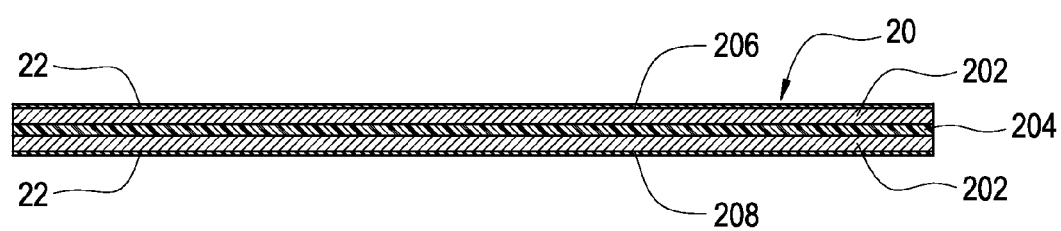
Figure 3C:
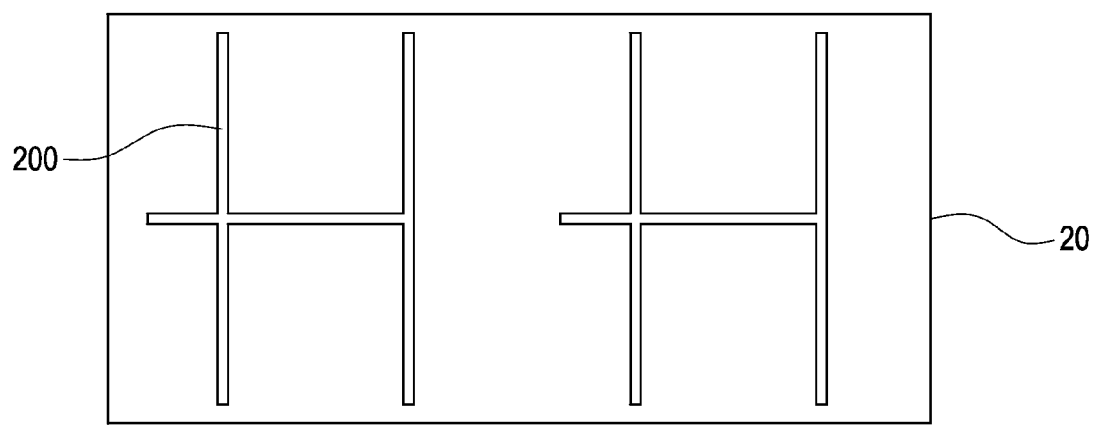
Figure 3D:
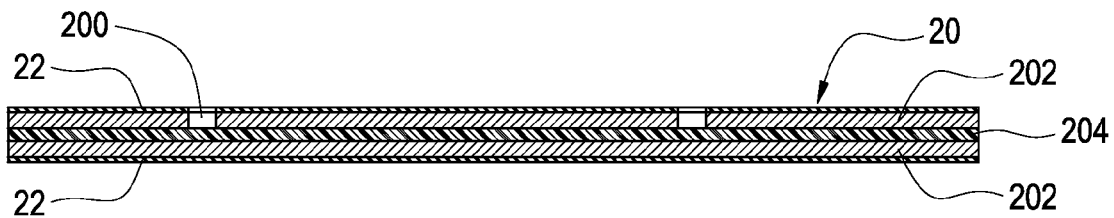
Figure 3E:
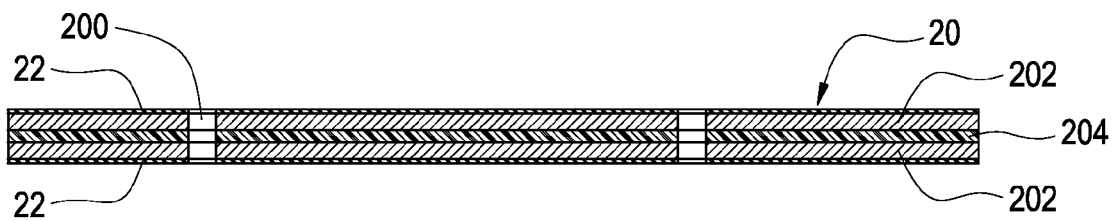
Figure 3F:
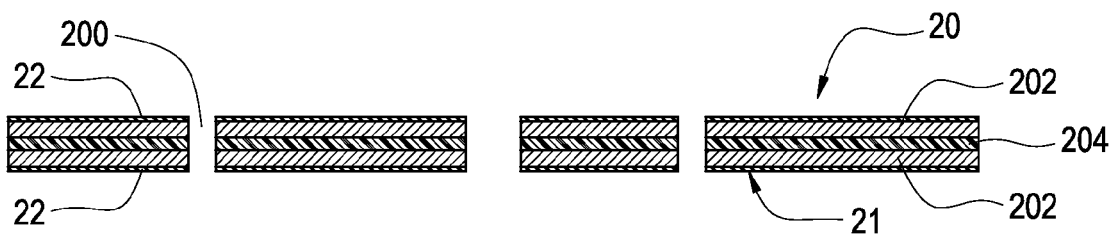
Figure 3G:
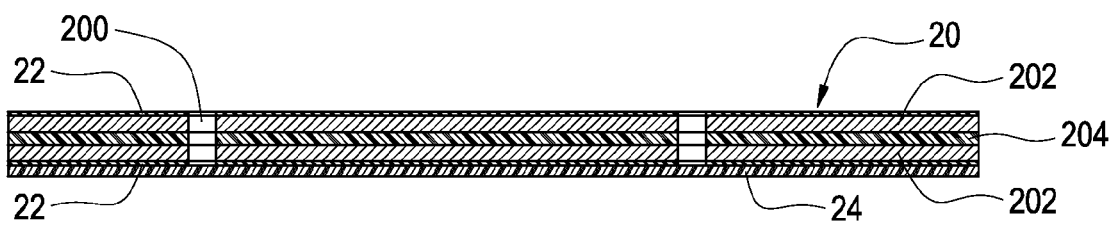
Figure 3H:
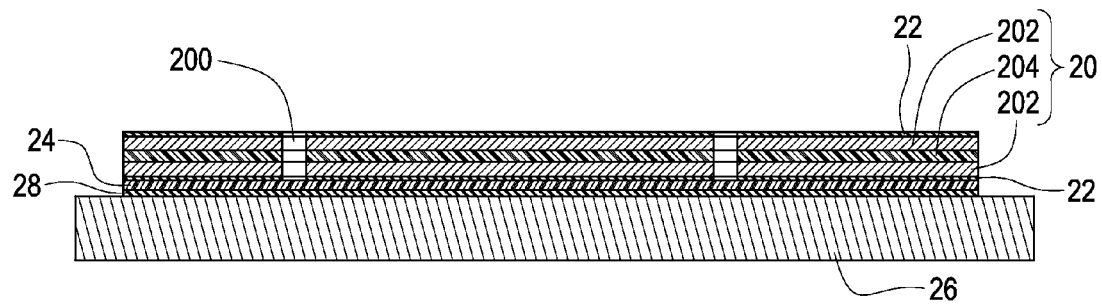
Figure 3I:
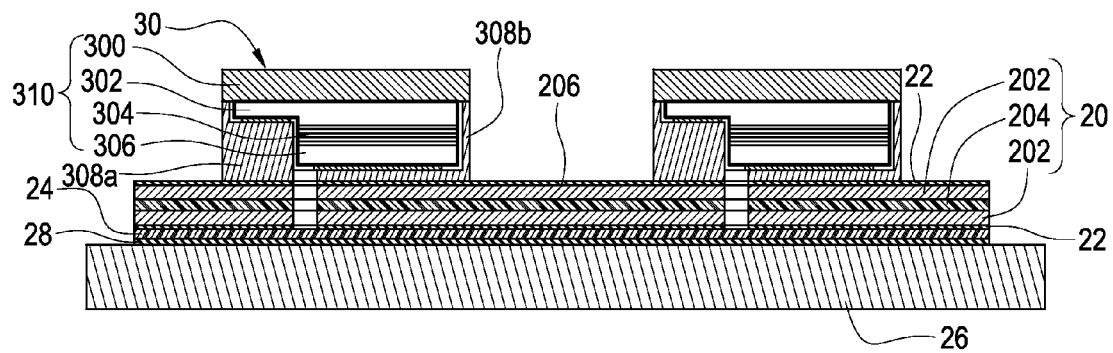
Figure 3J:
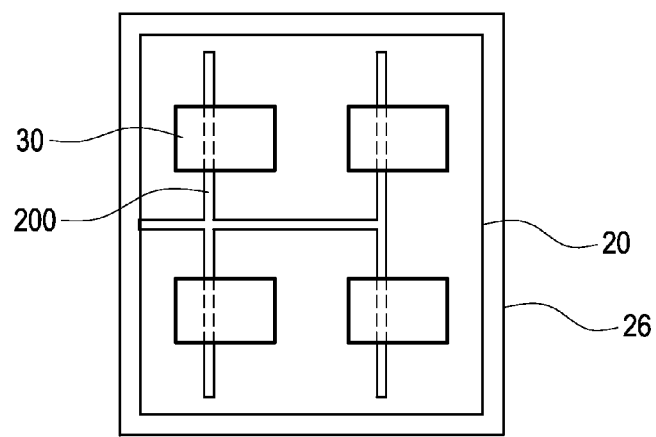
Figure 3K:
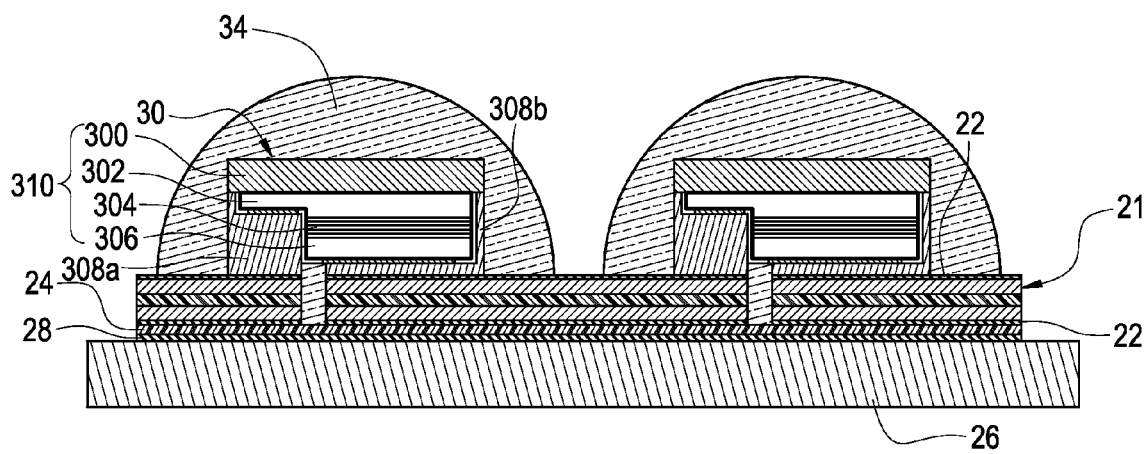
Figure 3L:
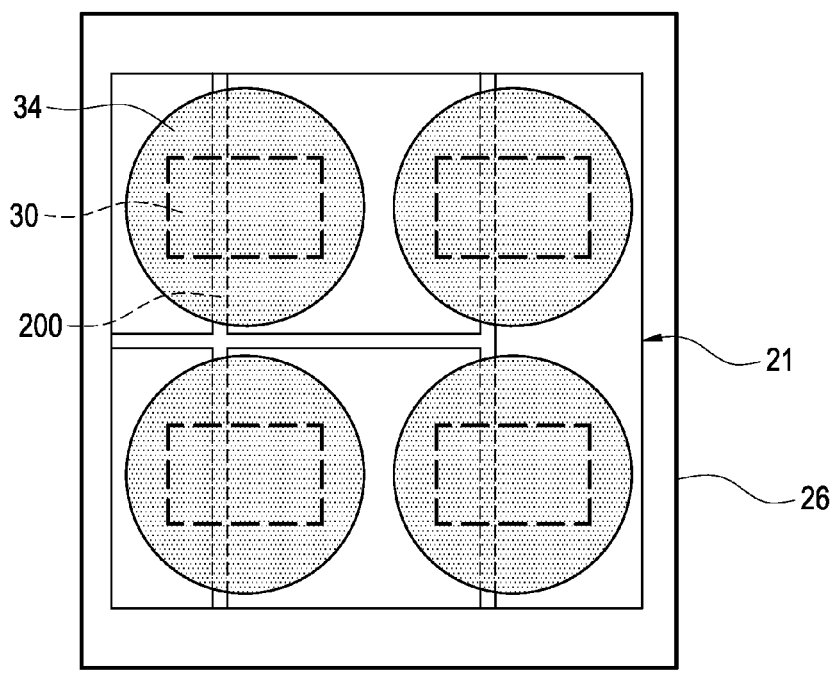
Figure 3M:
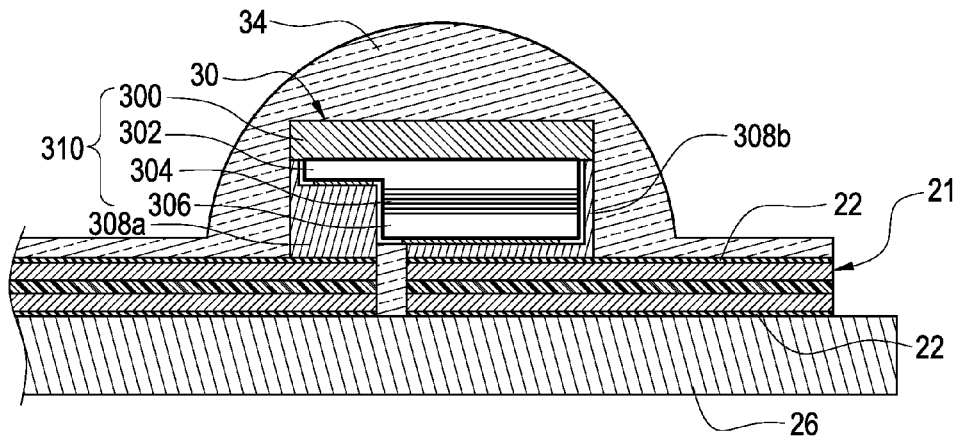
Figure 3N:
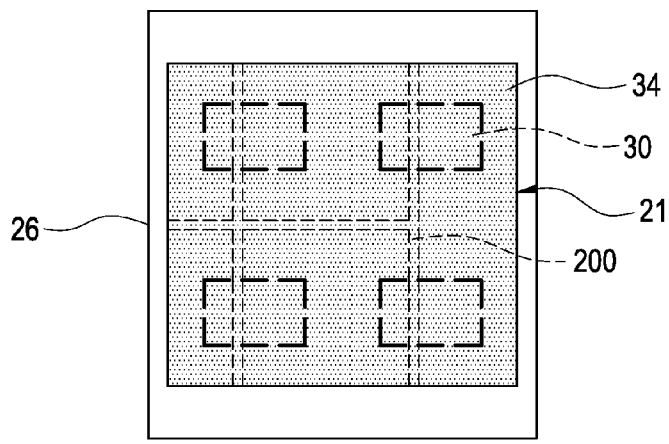
Figure 3O:
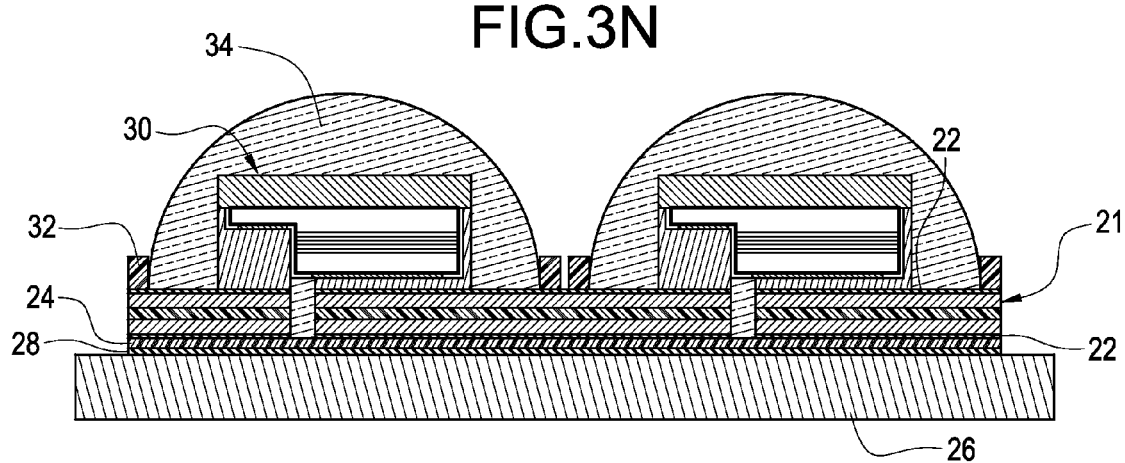
Figure 3P:
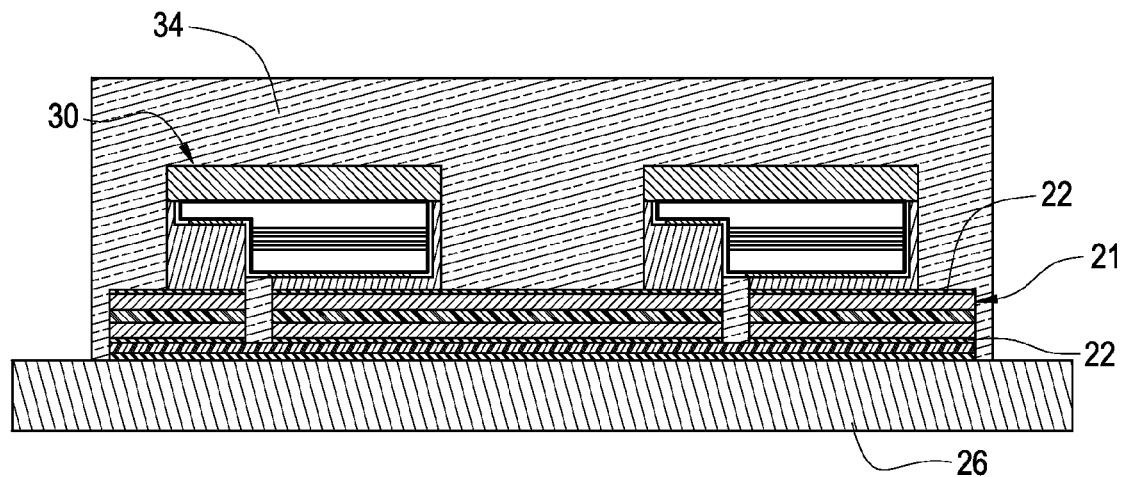
Figure 3Q:
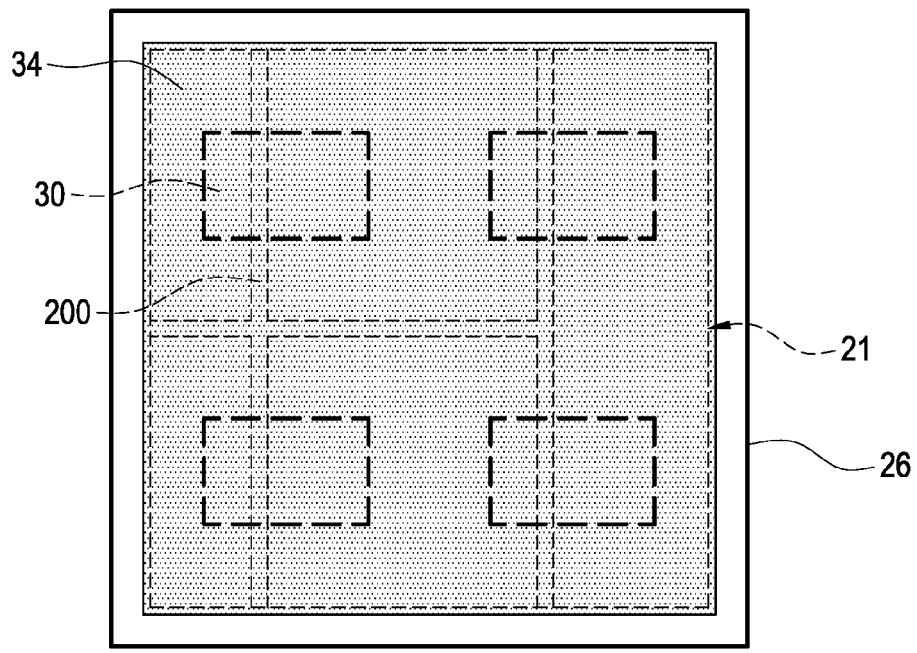
Figure 3R:
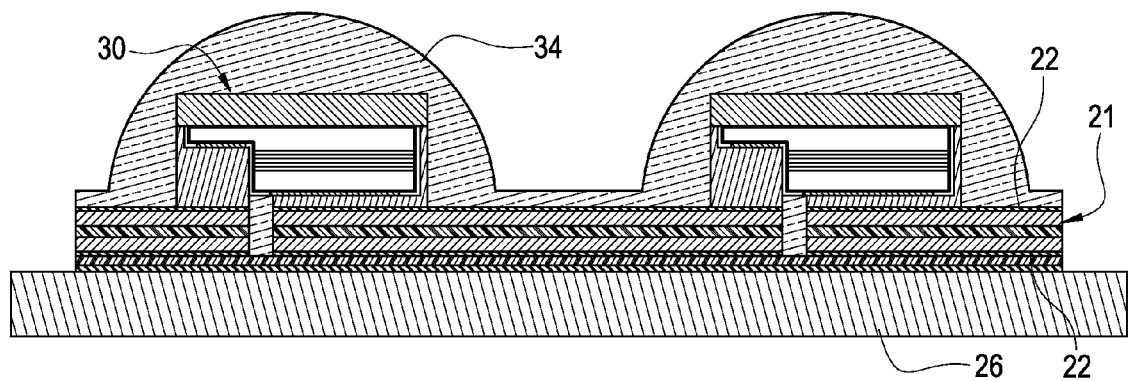
Figure 3S:
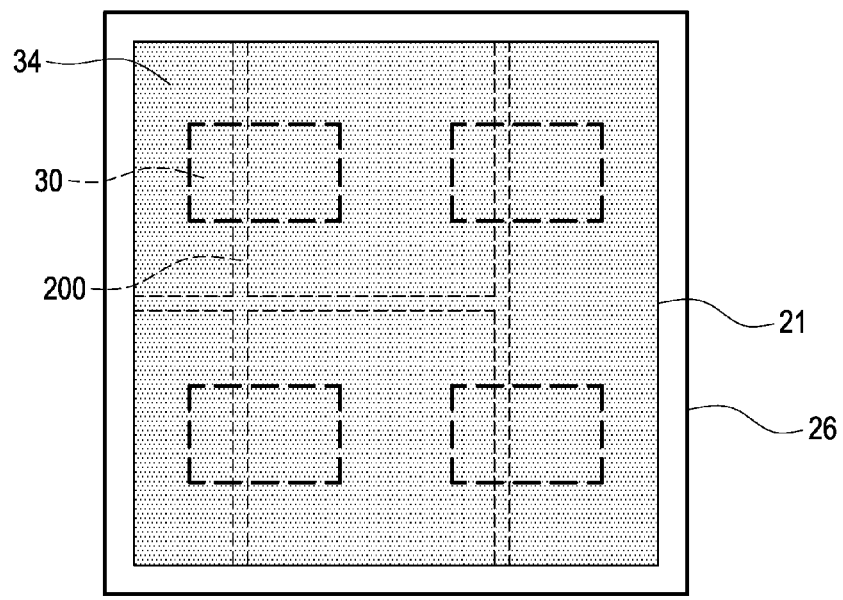
Figure 3T:
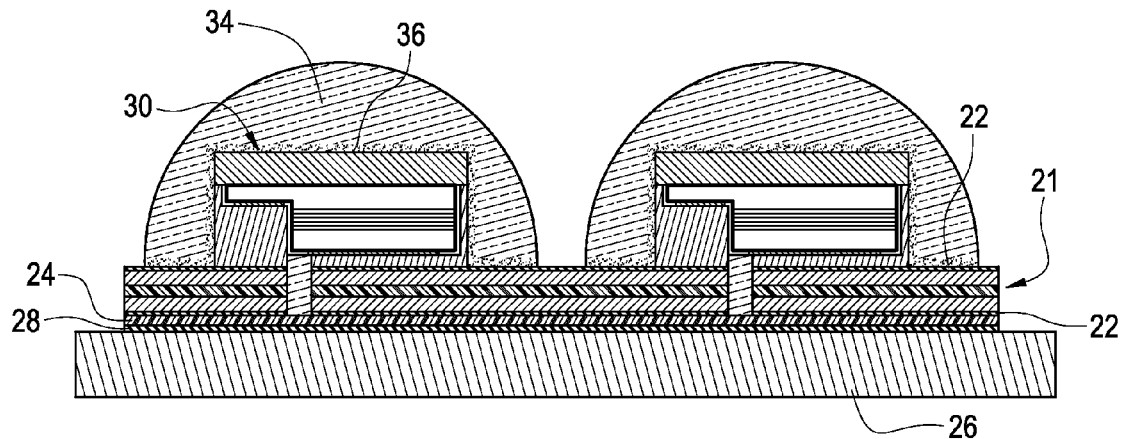
Figure 3U:
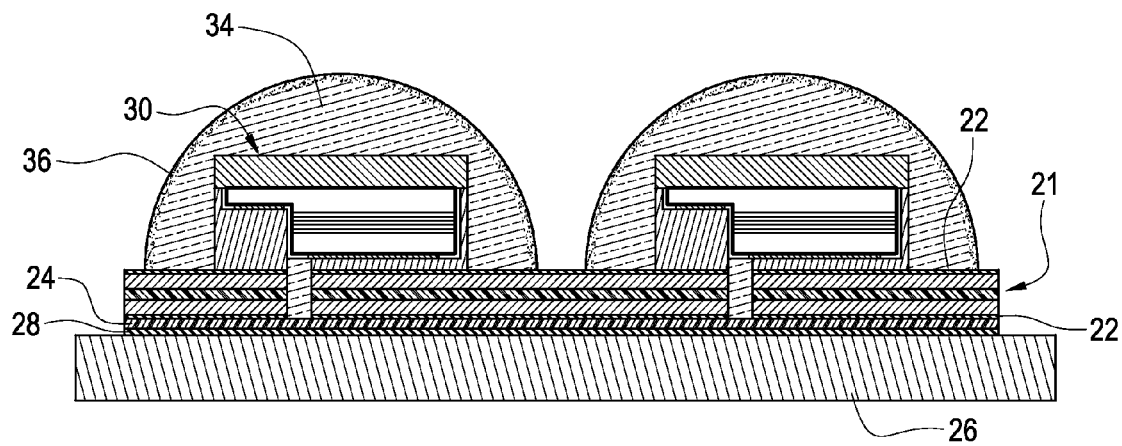
Figure 3V:
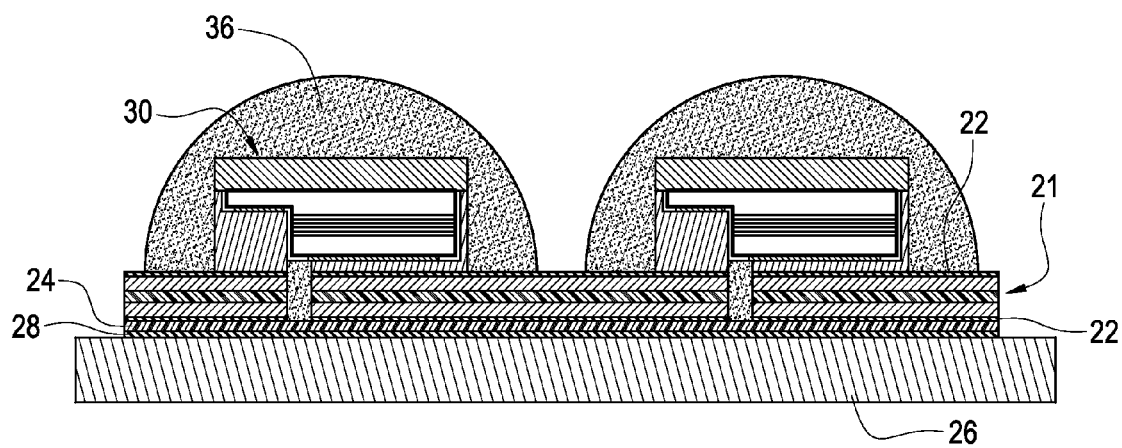
Figure 3W:
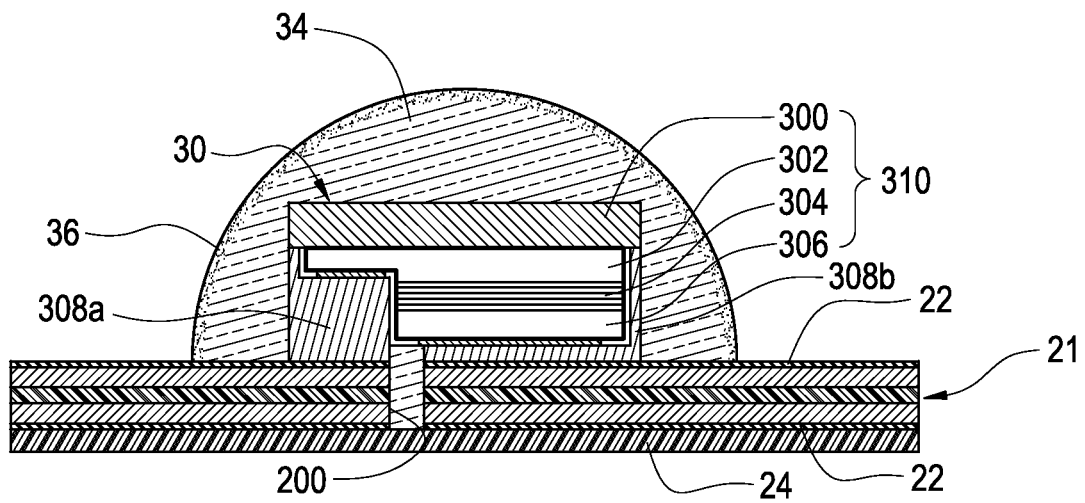
Figure 3X:
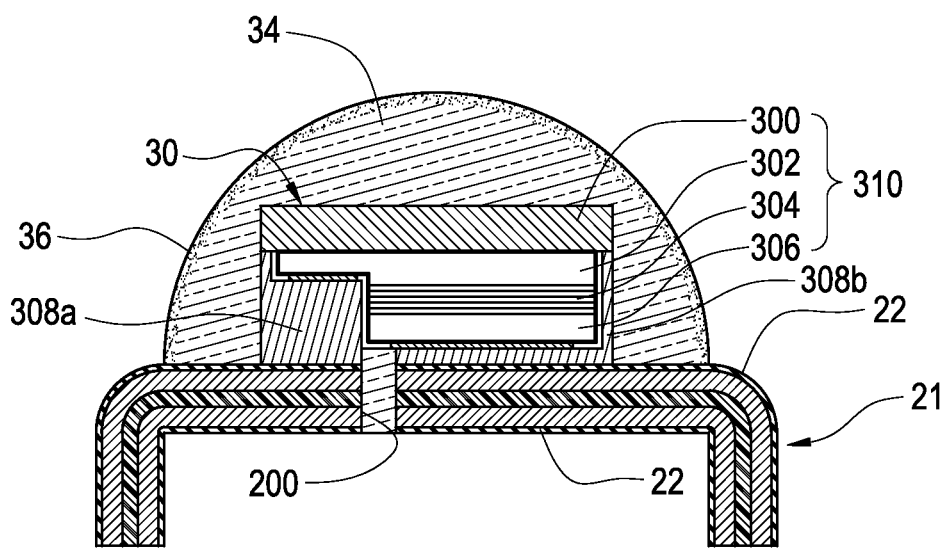
Figure 3Y:
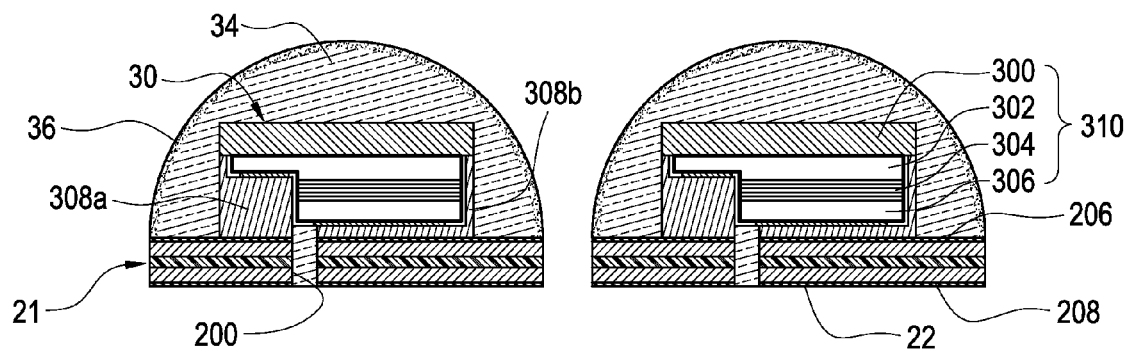
Figure 3Z:
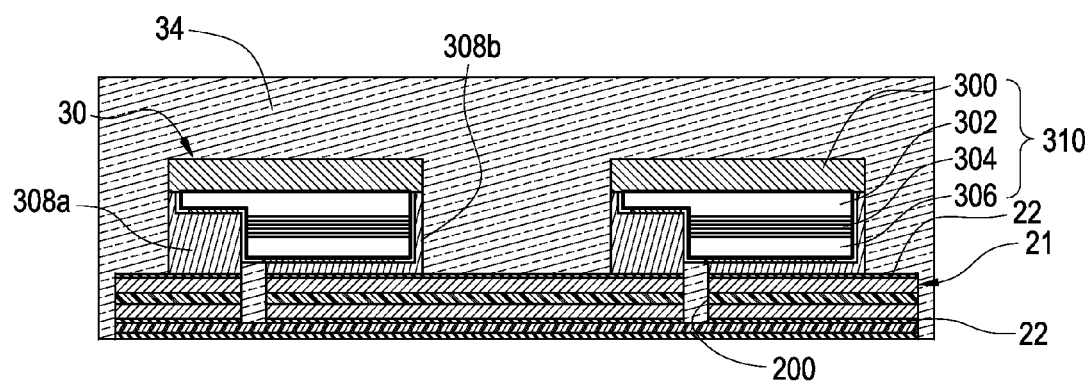

Reference is made to FIG. 3A to 3Z, which are process diagrams showing the manufacturing method of the light emitting semiconductor element according to a second embodiment of the present invention. The light emitting semiconductor element may be, but not limited to, light emitting diode.

As shown in FIG. 3A, a first light electrically conductive layer 20 is provided at first. The first light electrically conductive layer 20 is of plate shape and the thickness t is larger than 5 micrometers for quickly conducting heat generated by light emitting semiconductor die placed thereon. The first light electrically conductive layer 20 includes two second electrically conductive layers 202 and an intermediary layer 204. The intermediary layer 204 is disposed between the second electrically conductive layers 202. The second electrically conductive layers 202 may be, for example, copper, and the intermediary layer 203 may be flexibly isolating material, such as polyimide (PI). The first electrically conductive layer 20 further includes an upper surface 206 and a lower surface 208 opposite to the upper surface 206. In the practical application, the stack structure of the first electrically conductive layer 20 may be adjusted for demand and limitation. Certainly, the first electrically conductive layer 20 may only include the second electrically conductive layer 202.

As shown in FIG. 3B, a shielding layer 22 is formed on one of the upper surface 206 and the lower surface 208 of the first electrically conductive layer 20. In this embodiment, the shielding layer 22 is simultaneously formed on the upper surface 206 and the lower surface 208. Preferably, the shielding layer 22 may be reflecting layer with light reflecting effect or protecting layer which can enhance the physical strength of the first electrically conductive layer 20.

Next, a plurality of grooves 200 are formed on the structure mentioned above, and the grooves 200 may be designed with particular patterns, as shown in FIG. 3C. The grooves 200 may be formed on the first electrically conductive layer 20 by stamping, etching or half-etching. The grooves 200 may only penetrate one second electrically conductive layer 202, as shown in FIG. 3D, or the grooves 200 may simultaneously penetrate the second electrically conductive layers 202 and the intermediary layer 204, as shown in 3E. For the convenience of following description, the grooves 200 are, but not limited to, simultaneously penetrate the second electrically conductive layers 202 and the intermediary layer 204. In addition, the first electrically conductive layer 20 may be separated into a plurality of electrically conductive units 21 by the grooves 200, as shown in FIG. 3F.

It should be noted that when the first electrically conductive layer 20 is separated into a plurality of independent blocks, each block is referred to as electrically conductive unit 21 in following description.

After forming the grooves, an isolating layer 24 is disposed on the structure mentioned above, as shown in FIG. 3G. The thickness of the isolating layer 24 may be, but not limited to, designed smaller than 100 micrometers.

Next, the structure mentioned above is disposed on a temporary substrate 26, as shown in FIG. 3H. An adhesive 28 is included between the first electrically conductive layer 20 and the temporary substrate 26. The adhesive 28 is preferably thermal release tape (TRT).

After that, a plurality of light emitting semiconductor dies 30 are placed on the first electrically conductive layer 20 and electrically connected thereto, as shown in 3I. The grooves 200 are partially exposed to the light emitting semiconductor dies 30, as shown in FIG. 3J. Each light emitting semiconductor die 30 includes a plurality of semiconductor layers 310 and two connecting pads 308a and 308b. In this embodiment, the semiconductor layers 310 for emitting blue light and include a substrate 300, an N-type gallium nitride 302, a multiple quantum well 304 and a P-type gallium nitride 306 disposed in sequence. The connecting pad 308a is disposed on the N-type gallium nitride 302, the connecting pad 308b is disposed in the P-type gallium nitride 306, so that the light emitting semiconductor die 30 is of lateral structure. In the practical application, lighting color and stacking structure of the semiconductor layer 310 may be adjusted for practical demand and limitation. The light emitting semiconductor dies 30 may also be vertical structure.

As shown in FIG. 3I, the light emitting semiconductor dies 30 are disposed on the upper surface 206 of the first electrically conductive layer 20 in flip chip manner, and the connecting pads 308a and 308b of the light emitting semiconductor die 30 are across the groove 200 and connected to the first electrically conductive layer 20. The two connecting pads 308a and 308b of the light emitting semiconductor dies 30 are electrically connected to the first electrically conductive layer 20 by soldering, spreading silver glue or electrical silicone, flux eutectic bonding technology or direct eutectic bonding technology. As shown in FIG. 3J, the light emitting semiconductor dies 30 may be electrically connected in parallel or series through the grooves 200 with particular patterns.

As shown in FIG. 3K to FIG. 3N, a light transmitting layer 34 is formed for covering the light emitting semiconductor dies 30, and then is eliminated with partial first electrically connective layer 20, thus the first electrically conductive layer 20 is separated into a plurality of electrically conductive units 21. The light emitting semiconductor dies 30 are electrically connected in parallel or series through the electrically conductive units 21. The light transmitting layer 21 compactly covers the light emitting semiconductor dies 30 and fills within the grooves 200 under the light emitting semiconductor dies 30 through the grooves 200 exposed to the light emitting semiconductor dies 30 and links the electrically conductive units 21. The light transmitting layer 34 is preferably made of light-pervious isolating material for providing good electrically isolating effect. As shown in FIGS. 3K and 3L, the light transmitting layer 34 covers the light emitting semiconductor dies 30, respectively, thus each light emitting semiconductor die 30 is of single-chip package type. The light transmitting layer 34 covering each light emitting semiconductor die 30 is substantially of hemisphere shape for effectively enhancing light extracting effect. As shown in FIG. 3M and FIG. 3N, the light transmitting layer 34 simultaneously covers the light emitting semiconductor dies 30 and the electrically conductive units 21, thus the light emitting semiconductor dies 30 are of multi-chip package type. The distance located between an upper surface of the light transmitting layer 34 and the electrically conductive unit 21 is gradually decreased along a direction away from the light emitting semiconductor dies 30, thus the light transmitting layer 34 covering each light emitting semiconductor die 30 is substantially of hemisphere shape for effectively enhancing light extracting effect.

The light transmitting layer 34 may be formed by molding, dispensing or placing lens. The electrically conductive units 21 may be formed with a dam 32 surrounding the light emitting semiconductor die 20 thereon when the light transmitting layer 30 is formed by dispensing, as shown in FIG. 3O. The dam 32 is used to provide space-limiting, thus the light transmitting layer 34 is of hemisphere shape for effectively enhancing light extracting effect.

Moreover, in the embodiment that the first electrically conductive layer 21 is separated into multiple electrically conductive units 21 through the grooves 200, a surface area of the electrically conductive units 21 must be larger than a surface area of the light emitting semiconductor die 30. Furthermore, as shown in FIGS. 3P and 3Q, the light transmitting layer 34 simultaneously covers the light emitting semiconductor dies 30 and the fringe of the electrically conductive units 21 for providing preferable electrically isolating effect. The distance of the upper surface of the light transmitting layer and the electrically conductive units is uniform.

As shown in FIG. 3R, the distance of the upper surface of the light transmitting layer 34 and the electrically conductive units 21 is gradually decreased along a direction away from the light emitting semiconductor dies 30, thus the light transmitting layer 34 covering the light emitting semiconductor dies 30 is substantially of hemisphere shape for effectively enhancing light extracting effect. In addition, the light emitting semiconductor dies 30 may be electrically connected in parallel or series through the electrically conductive units 21, as shown in FIG. 3S. The electrically connecting type shown in the FIG. 3S is only for one example and not the limitation of the protection scope.

A wavelength-converting matter 36 is disposed on the upper surface or lower surface the light transmitting layer 34, or disposed within the light transmitting layer 34. The wavelength-converting matter 36 may be phosphor, quantum dot phosphor quantum well film. The light emitted from the light emitting semiconductor dies 30 passes through the wavelength-converting matter 36, and is converted into wavelength-converted light. In this embodiment, the light emitting from each light emitting semiconductor die 30 is blue, and the wavelength-converted light is yellow. The wavelength-converting matter 36 coverts a part of light emitted from the light emitting semiconductor dies 30 into wavelength-converted light (yellow light), which is to be mixed with other blue light emitted from the light emitting semiconductor dies 30 to generate white light. The wavelength-converting matter 36 may be placed near the light emitting semiconductor die 30, as shown in FIG. 3T, and the wavelength-converting matter 36 may be placed in front of the light transmitting layer 34, and cover the light emitting semiconductor die 30. Namely, the wavelength-converting matter is placed close to the light emitting semiconductor dies 30. The wavelength-converting matter 36, however, may be placed on the light transmitting layer 34 after forming the light transmitting layer 34 on the light emitting semiconductor dies 30. Namely, the wavelength-converting matter 36 is placed far from the light emitting semiconductor die 30, as shown in FIG. 3U. The wavelength-converting matter 36 may also place within the light transmitting layer 34 uniformly, as shown in FIG. 3V. The wavelength-converting matter 36 is directly mixed with the light transmitting layer 36, and covers the light emitting semiconductor die 30 through dispensing or molding.

As shown in FIGS. 3W to 3Z, a plurality of light emitting semiconductor elements are form by cutting, and then the temporary substrate 26 is removed. Simultaneously, the electrically conductive layer 20 under each light emitting semiconductor die 30 is separated into at least two electrically conductive units 21, and the groove 200 is located between each two electrically conductive units 21. In addition, each two electrically conductive units 21 are not electrically connected to each other for preventing the light emitting semiconductor from short circuit.

As shown in FIG. 3W, the surface area of the electrically conductive unit 21 is larger than the area of the electrically conductive unit 21 covering with the light transmitting layer 34. In addition, the isolating layer 24 may be removed and the electrically conductive unit 21 is bent for the function of convenient insertion, as shown in FIG. 3X.

As shown in FIG. 3Y, the surface area of the electrically conductive units 21 is substantially equal to the area of the electrically conductive units 21 covering with the light transmitting layer 34.

As shown in FIG. 3Z, the light transmitting layer 34 covers multiple light emitting semiconductor dies 30, so as to form a multi-chip package light emitting semiconductor element. In addition, the light emitting semiconductor dies 30 are in serial or parallel electrical connection through the electrically connected units 21.

Thus, the light emitting semiconductor element according to the present invention includes at least two electrically connected units 21, at least one light emitting semiconductor die 30 and a light transmitting layer 34. The two electrically conductive units 2 are substantially of plate shape and the thickness t is larger than 5 micrometers.

The light emitting semiconductor die 30 crosses over the two electrically conductive units 21, and includes a plurality of semiconductor layer 310 and two connecting pads 308a and 308b. The connecting pads 308a and 308b are electrically connected to the two electrically conductive units 21, respectively. The surface area of the electrically conductive units 21 is larger than the surface area of the light emitting semiconductor die 30.

The light transmitting layer 34 covers the light emitting semiconductor die 30 and partially fills within the groove 200 for linking the electrically conductive units 21 and the light emitting semiconductor die 30, and protecting the light emitting semiconductor die 30, as well as providing good isolating effect and enhancing light extracting effect. The light transmitting layer 34 may completely cover the upper surface 206 of the electrically conductive units 21, as shown in FIG. 3Y. In addition, the light emitting semiconductor element may optionally include a shielding layer 22. The shielding layer 22 is disposed on at least one of the upper surface 206 and the lower surface 208 of the electrically conductive units 21, where the lower surface 208 is opposite to the upper surface 206.

The light emitting semiconductor element further optionally includes a wavelength-converting matter 36 disposed within the light transmitting layer 34 for converting light emitted from the light emitting semiconductor die 30 and passing therethrough into wavelength-converted light. The wavelength-converting matter 36 may dispose close to or far away from the light emitting semiconductor die 30. However the wavelength-converting matter may also mix with the light transmitting layer 34 uniformly.

Furthermore, the light transmitting layer 34 may simultaneously cover multiple light emitting semiconductor dies 20, completely cover the upper surface 206 of the electrically conductive units 21 and the fringe thereof, as shown FIG. 3Z.

Figure 4A:
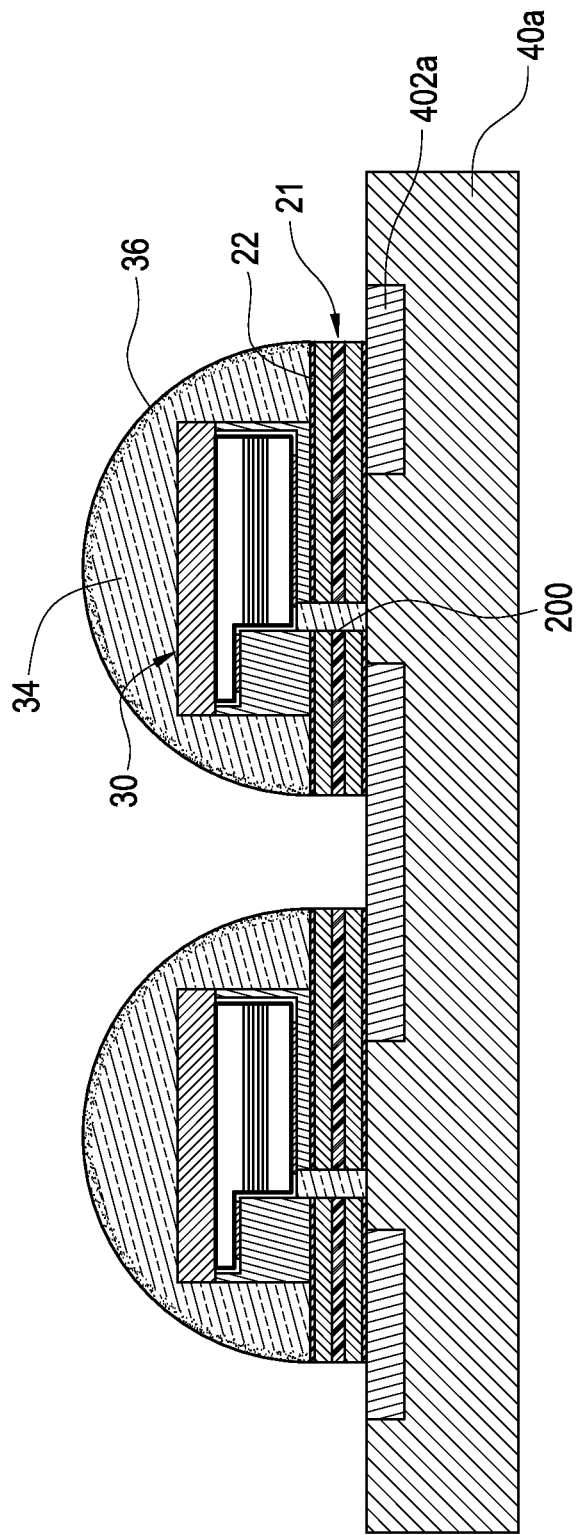
FIG. 4A is a sectional view of a lighting module according to a first embodiment of the present invention.

The light emitting semiconductor element may optionally include an isolating layer 24 disposed under the shielding layer 22. The light transmitting layer 34 partially covers the upper surface 206 of the electrically conductive units 21, as shown in FIG. 3W. In the light emitting semiconductor element, the electrically conductive units 21 can be optionally bent for fulfilling the function of convenient insertion, as shown in FIG. 3X As shown in FIG. 4A, a lighting module is formed by combining with the light emitting semiconductor element mentioned above and a base 40a. For the convenience of following description, the light emitting semiconductor element is, for example, light emitting diode as FIG. 3Y. The base 40a may be a circuit board, and at least a circuit pattern 402a is formed thereon. At least a light emitting semiconductor element is placed on the base 40a, and the electrically conductive units 21 of the light emitting semiconductor element is electrically connected to the circuit pattern 402a. The amount of the light emitting semiconductor element may be one or more, and in this embodiment, the amount of the light emitting semiconductor elements is, for example, two. In addition, the light emitting semiconductor elements are electrically connected in series through the circuit pattern 402a. In the practical application, the light emitting semiconductor elements are electrically connected in parallel through the circuit pattern 402a.

In addition, the lighting module may be attached to a heat radiator, such as, cooling fin. However, as shown in FIG. 4B, the base 40b of the lighting module may be a heat radiator. The base 40b is formed with at least one circuit pattern 402b in advance. The electrically conductive units 21 of the light emitting semiconductor element are electrically connected to the circuit pattern 402b. Thus, the heat generated by the lighting light emitting semiconductor element can quickly conduct to air through the base 40b.

Figure 4C:
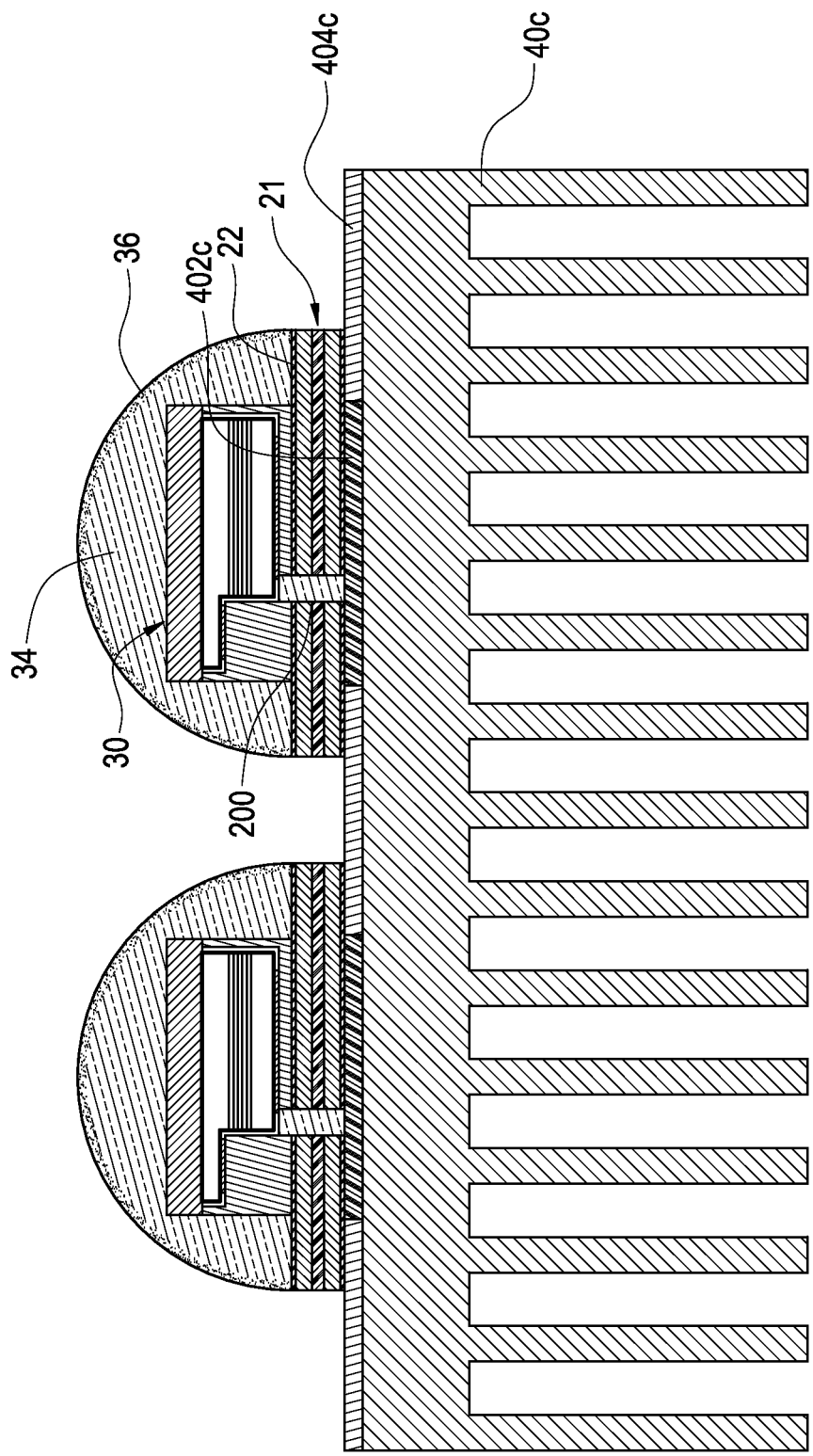
FIG. 4C is a sectional view of a lighting module according to a third embodiment of the present invention.

As shown in FIG. 4C, the circuit patterns 404c may additionally be disposed on an upper surface of a base 40c, and an isolating body 402c is disposed between each two adjoining circuit patterns 404c for enhancing electrically isolating effect. The light emitting semiconductor element placed on the base 40c and electrically connected to circuit patterns 404c.

Figure 5:
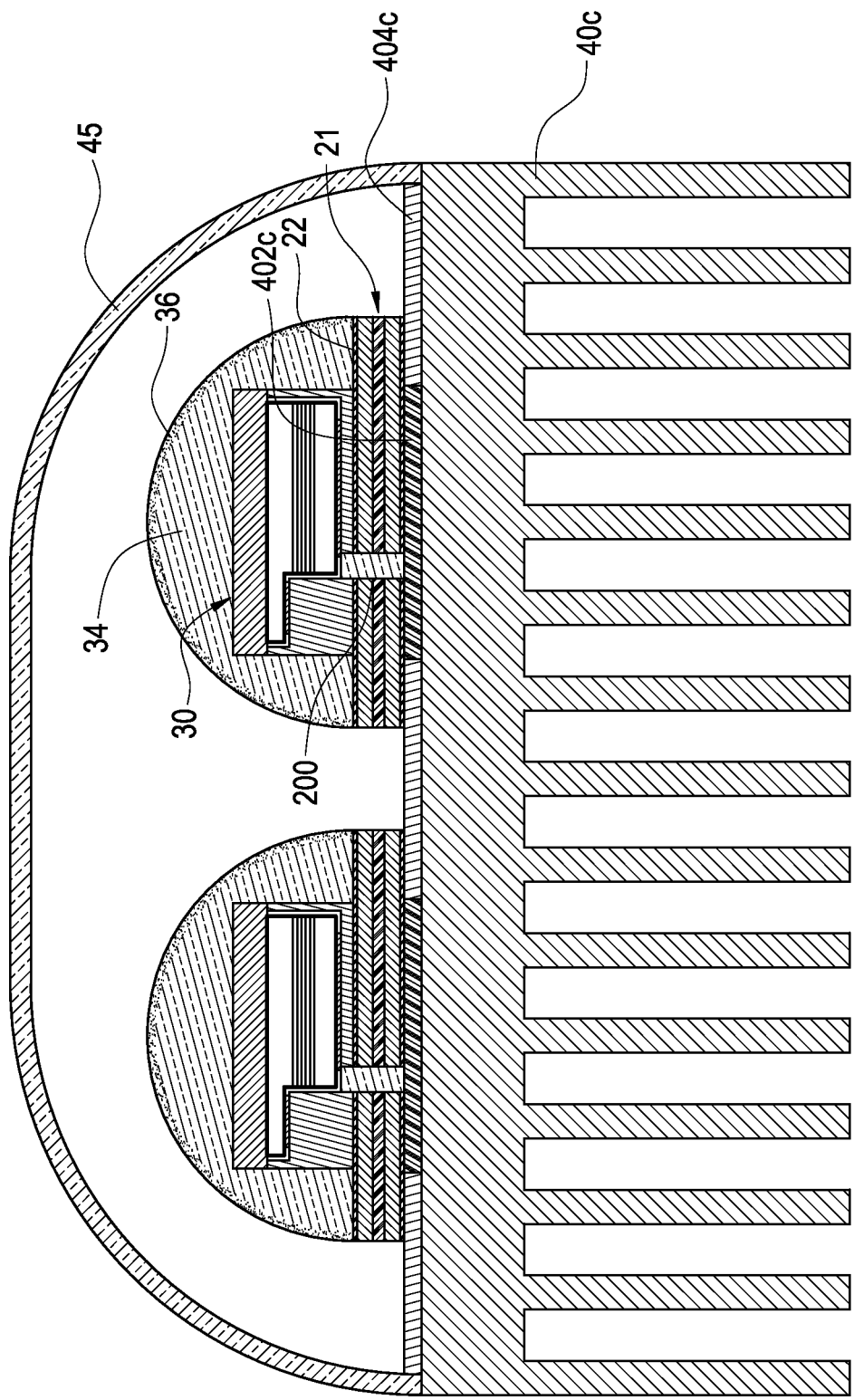
FIG. 5 is a sectional view of an illuminant device according to a first embodiment of the present invention.

The lighting module mentioned above may be combined with a light-transparent shell 45 to form an illuminant device, as shown in FIG. 5, and the lighting module can provide indoor or outdoor lighting. The illuminant device includes a light module as shown in FIG. 4C and the light-transparent shell 45. The light-transparent shell 45 is connected to the base 40c so that the light emitting semiconductor element is located between the light-transparent shell 45 and the base 40c, and the light emitting semiconductor element emits light toward the light-transparent shell 45. In addition, at least one of an inner surface or an outer surface of the light-transparent shell 45 may include a wavelength-converting material, such as phosphor, for converting light emitted from the light emitting semiconductor element into wavelength-converted light, thus fulfilling light converting effect. Certainly, the wavelength converting material may be also disposed within the light-transparent shell 45.

Figure 6A:
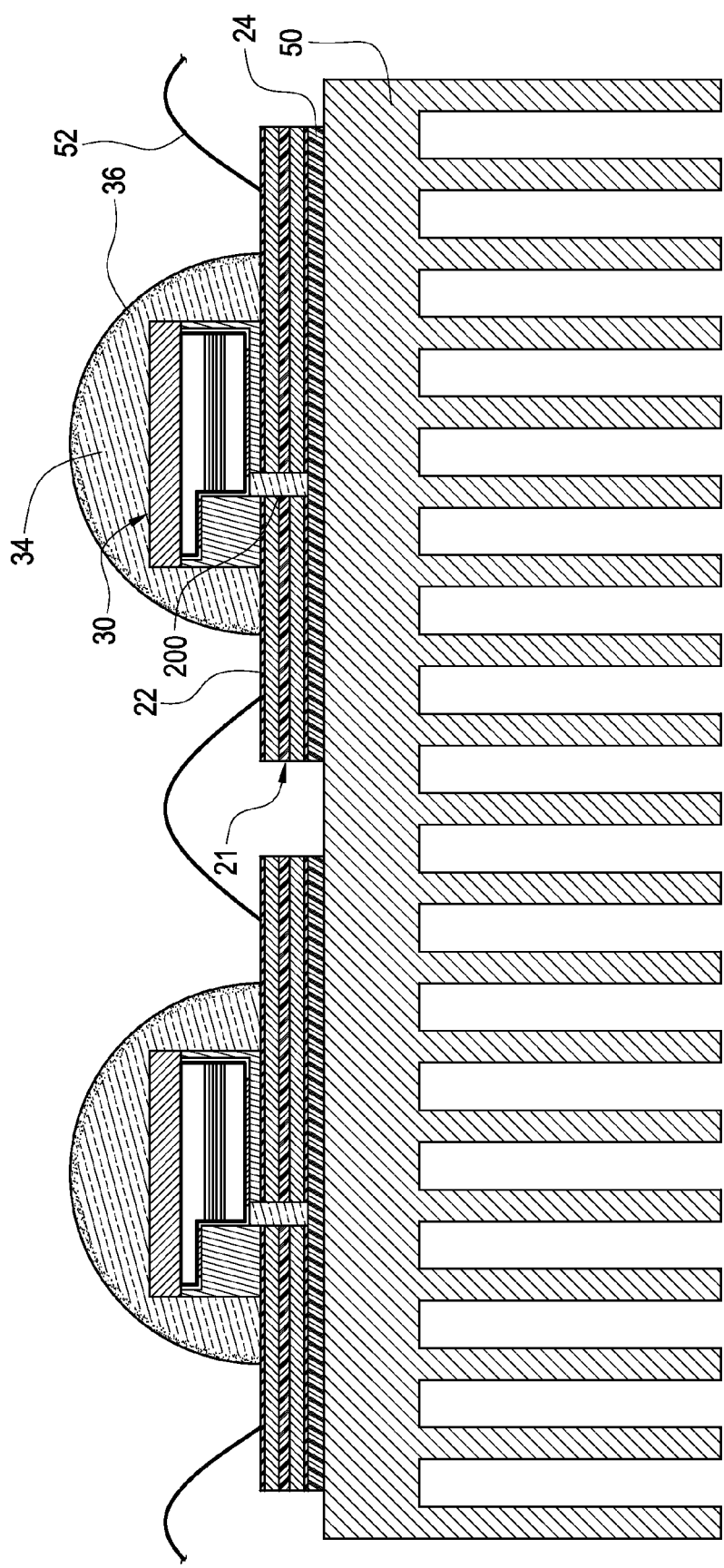
FIG. 6A is a sectional view of a lighting module according to a fourth embodiment of the present invention.
Figure 6B:
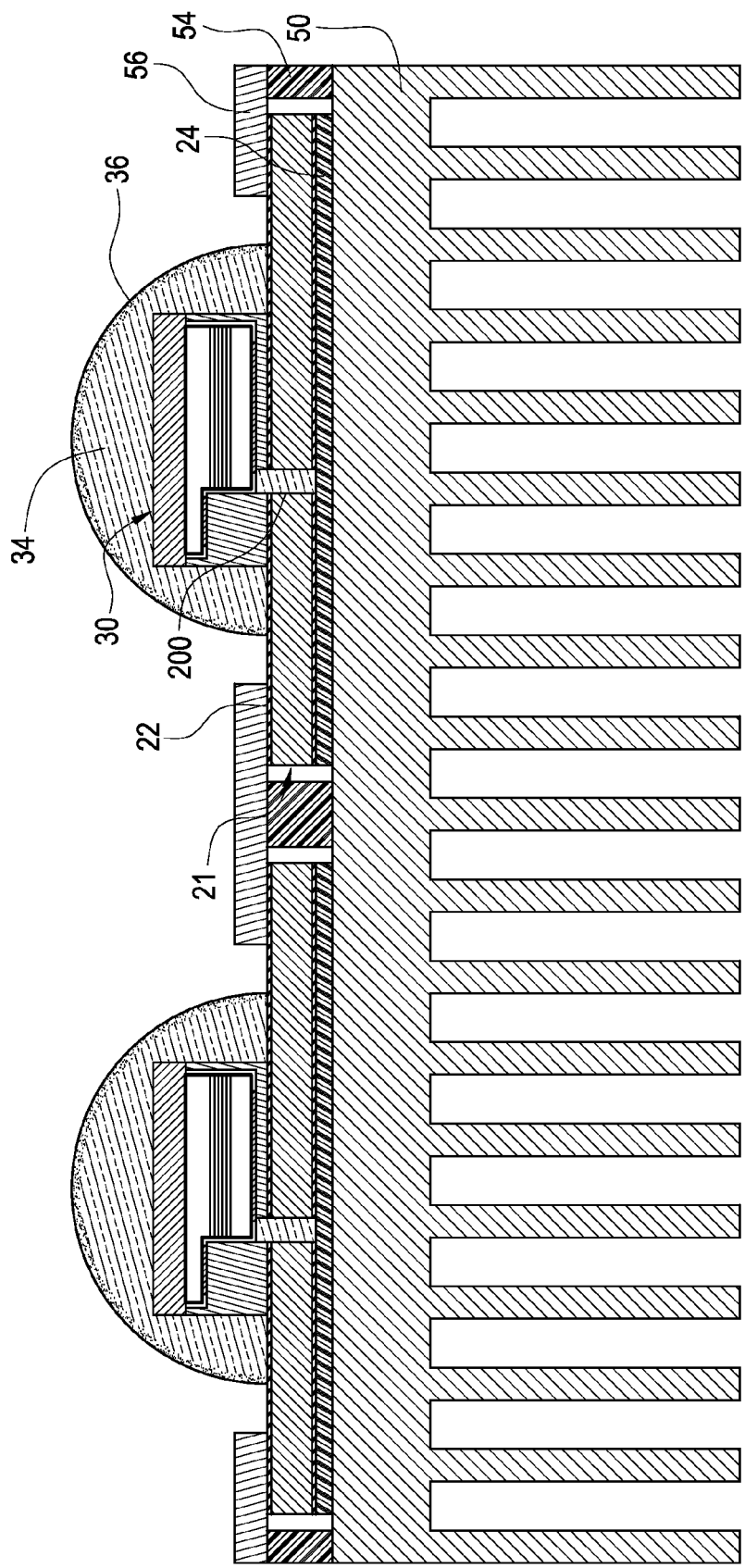
FIG. 6B is a sectional view of a lighting module according to a fifth embodiment of the present invention.

As shown in FIG. 6A, the light emitting semiconductor elements include an isolating layer 24, and the light emitting semiconductor elements is electrically connected to each other through a plurality of connecting lines 52. However, the connecting lines 52 may be replaced by a plurality of electrically conductive bumps 56, as shown in FIG. 6B, for electrically connecting the light emitting semiconductor elements. Furthermore, the electrically conductive bumps 56 may optionally stand on the base 50 through an isolating matter 54, thus the electrically conductive units 21 of the light emitting semiconductor elements are contacted, and the light emitting semiconductor elements are electrically connected. Certainly, the light module mentioned in the FIGS. 6A and 6B may be combined with a light-transparent shell to form an indoor or outdoor illuminant device.

To sum up, the electrically conductive units and the light transparent layer of the light emitting semiconductor element of the present invention collectively seals the light emitting semiconductor die, which can reduce the volume of the light emitting semiconductor element and enhance the electrically isolating effect. In addition, the thickness of the electrically conductive units is larger than 5 micrometers, and the surface area of the electrically conductive units is larger than the surface area of the light emitting semiconductor die, thus heat generated by the lighting light emitting semiconductor die can quickly conduct, and the difficulty of soldering the light emitting semiconductor element and circuit board or other boards can be reduced.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A light emitting semiconductor element comprising:
   a plurality of first electrically conductive layers and a groove located between two adjacent first electrically conductive layers;
   a plurality of light emitting semiconductor dies, each light emitting semiconductor die comprising a plurality of semiconductor layers and two connecting pads, the semiconductor layers comprising a N-layer and a P-layer, the connecting pads respectively disposed on the N-layer and the P-layer, the connecting pads crossing the groove and connected to the two adjacent first electrically conductive layers, wherein the connecting pad disposed on the N-layer of one of the light emitting semiconductor dies and the connecting pad disposed on the P-layer of another of the light emitting semiconductor die are connected to one of the first electrically conductive layers, and the light emitting semiconductor dies are electrically connected in series; and
   a light transmitting layer covering all of the light emitting semiconductor dies and the first electrically conductive layers and at least filling within the groove for linking the first electrically conductive layers.

2. The light emitting semiconductor element in claim 1, further comprising a wavelength-converting member disposed within the light transmitting layer.

3. The light emitting semiconductor element in claim 1, wherein the light transmitting layer covers the light emitting semiconductor dies and the first electrically conductive layers.

4. The light emitting semiconductor element in claim 1, wherein the thickness of the first electrically conductive layers is larger than 5 micrometers.

5. The light emitting semiconductor element in claim 1, wherein a surface area of two adjacent first electrically conductive layers is larger than that of the light emitting semiconductor die connected thereto.

6. The light emitting semiconductor element in claim 1, further comprising an isolating layer disposed under the first electrically conductive layers.

7. The light emitting semiconductor element in claim 1, wherein each first electrically conductive layer comprising a plurality of second electrically conductive layers and an intermediary layer disposed within the second electrically conductive layers, and the groove at least penetrates one of the second electrically conductive layers.

8. A light emitting semiconductor element comprising:
two first electrically conductive layers and a groove located between the first electrically conductive layers to prevent the first electrically conductive layer from conducting;
a plurality of light emitting semiconductor dies crossing over the first electrically conductive layers, and the light emitting semiconductor dies electrically connected in parallel via the first electrically conductive layers; and
a light transmitting layer covering all of the light emitting semiconductor dies and the first electrically conductive layer.

9. The light emitting semiconductor element in claim 8, further comprising a wavelength-converting member disposed within the light transmitting layer.

10. The light emitting semiconductor element in claim 8, wherein the light transmitting layer covers the light emitting semiconductor dies and the first electrically conductive layers.

11. The light emitting semiconductor element in claim 8, wherein the thickness of the first electrically conductive layers is larger than 5 micrometers.

12. The light emitting semiconductor element in claim 8, wherein a surface area of the first electrically conductive layers is larger than that of the light emitting semiconductor dies.

13. The light emitting semiconductor element in claim 8, further comprising an isolating layer disposed under the first electrically conductive layers.

14. The light emitting semiconductor element in claim 8, wherein each first electrically conductive layer comprising a plurality of second electrically conductive layers and an intermediary layer disposed within the second electrically conductive layers, the groove at least penetrates one of the second electrically conductive layers.

15. The light emitting semiconductor element in claim 8, wherein the light transmitting layer fills within the groove for linking the first electrically conductive layers.

\* \* \* \* \*